(12) United States Patent
Henriksen et al.

(10) Patent No.: US 10,063,256 B1
(45) Date of Patent: Aug. 28, 2018

(54) WRITING COPIES OF OBJECTS IN ENTERPRISE OBJECT STORAGE SYSTEMS

(71) Applicant: Cisco Technology, Inc., San Jose, CA (US)

(72) Inventors: Dana Marlow Henriksen, Lindon, UT (US); Mel J. Oyler, Pleasant Grove, UT (US); Ryan Michael Okelberry, Provo, UT (US); Kevin Wayne Kingdon, Hayward, CA (US)

(73) Assignee: Cisco Technology, Inc., San Jose, CA (US)

( * ) Notice: Subject to any disclaimer, the term of this patent is extended or adjusted under 35 U.S.C. 154(b) by 5 days.

(21) Appl. No.: 15/283,263

(22) Filed: Sep. 30, 2016

Related U.S. Application Data

(60) Provisional application No. 62/249,716, filed on Nov. 2, 2015.

(51) Int. Cl.
*H03M 13/00* (2006.01)
*H03M 13/11* (2006.01)
*G06F 3/06* (2006.01)

(52) U.S. Cl.
CPC .............. *H03M 13/11* (2013.01); *G06F 3/064* (2013.01); *G06F 3/067* (2013.01); *G06F 3/0619* (2013.01); *G06F 3/0625* (2013.01); *G06F 3/0659* (2013.01); *G06F 3/0683* (2013.01); *H03M 13/6566* (2013.01)

(58) Field of Classification Search
CPC .... H03M 13/11; G06F 3/0619; G06F 3/0625; G06F 3/064
See application file for complete search history.

(56) References Cited

U.S. PATENT DOCUMENTS

| | | | | |
|---|---|---|---|---|
| 7,206,845 B2* | 4/2007 | Banning | ................ | G06F 9/505 709/226 |
| 8,136,124 B2* | 3/2012 | Kosche | ............... | G06F 11/3447 714/47.1 |
| 8,832,130 B2* | 9/2014 | Doddavula | ....... | G06F 17/30575 707/759 |
| 8,850,113 B2* | 9/2014 | Baptist | ................ | G06F 11/1076 711/114 |
| 8,898,267 B2* | 11/2014 | Slik | ................... | G06F 17/30082 707/802 |
| 9,626,245 B2* | 4/2017 | Bakre | ................. | G06F 11/1076 |

(Continued)

*Primary Examiner* — Esaw T Abraham
(74) *Attorney, Agent, or Firm* — Ronald Fernando

(57) ABSTRACT

Various implementations disclosed herein enable writing a number of copies of object data or parity data associated with a data segment to a storage system. For example, in various implementations, a method of writing a number of copies of object data or parity data associated with a data segment is performed by a first storage entity of the storage system. In various implementations, the first storage entity includes a non-transitory computer readable storage medium and one or more processors. In various implementations, the method includes obtaining a data segment from an ingest entity in response to a request to write a number of copies of object data or parity data, determining whether the request is to write object data or parity data, and in response to determining that the request is to write object data, writing the number of copies of object data according to a shared resource utilization threshold.

20 Claims, 5 Drawing Sheets

(56) References Cited

U.S. PATENT DOCUMENTS

| | | | |
|---|---|---|---|
| 9,661,356 B2* | 5/2017 | Grube | H04N 21/2181 |
| 9,679,153 B2* | 6/2017 | Grube | G06F 21/64 |
| 2016/0026672 A1* | 1/2016 | Zhang | G06F 17/30203 |
| | | | 707/686 |
| 2016/0219120 A1* | 7/2016 | Vairavanathan | H04L 67/2842 |
| 2016/0246676 A1* | 8/2016 | Bakre | G06F 11/1076 |

* cited by examiner

WRITING COPIES OF OBJECTS IN ENTERPRISE OBJECT STORAGE SYSTEMS

PRIORITY CLAIM

This application claims priority to U.S. provisional patent application No. 62/249,716 filed on Nov. 2, 2015, the contents of which are hereby incorporated by reference.

TECHNICAL FIELD

The present disclosure relates generally to storage systems, and in particular, to writing copies of objects in enterprise object storage systems.

BACKGROUND

Some previously available storage systems enable the storage of various objects. For example, some previously available storage systems enable client devices to store documents, movies, TV shows, songs, etc. Many content providers utilize such storage systems to store objects that the content providers provide to client devices. Typically, content providers allow multiple client devices to access a particular object. For example, a content provider that provides movies allows multiple client devices to access the same movie. However, the Digital Millennium Copyright Act (DMCA) provides that a unique instance of an object be stored for each customer that owns the object.

BRIEF DESCRIPTION OF THE DRAWINGS

So that the present disclosure can be understood by those of ordinary skill in the art, a more detailed description may be had by reference to aspects of some illustrative implementations, some of which are shown in the accompanying drawings.

Figure 1:
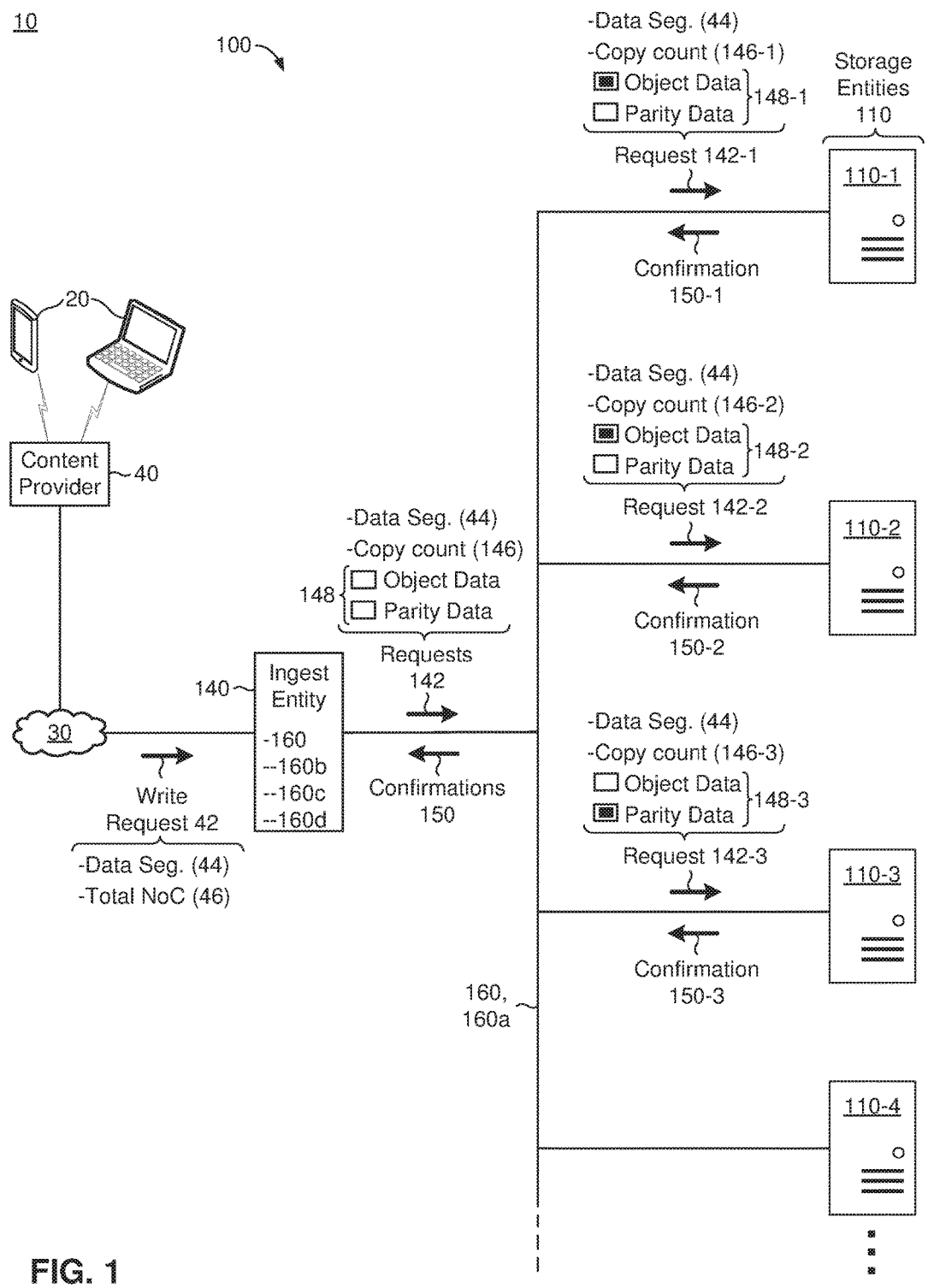
FIG. 1 is a schematic diagram of a storage system environment that includes a fault-tolerant enterprise object storage system in communication with a client device in accordance with some implementations.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DESCRIPTION OF EXAMPLE EMBODIMENTS

Numerous details are described herein in order to provide a thorough understanding of the illustrative implementations shown in the accompanying drawings. However, the accompanying drawings merely show some example aspects of the present disclosure and are therefore not to be considered limiting. Those of ordinary skill in the art will appreciate from the present disclosure that other effective aspects and/or variants do not include all of the specific details of the example implementations described herein. While pertinent features are shown and described, those of ordinary skill in the art will appreciate from the present disclosure that various other features, including well-known systems, methods, components, devices, and circuits, have not been illustrated or described in exhaustive detail for the sake of brevity and so as not to obscure more pertinent aspects of the example implementations disclosed herein.

Overview

Some previously available storage systems provide fault tolerance through data mirroring. With data mirroring, multiple copies of an object are stored on a vault disk and again on different drives, so that a drive failure can only damage at most one copy of the data. The downside of data mirroring is that it is expensive due to being resource-intensive. For example, to be resilient to one failure, a storage system that utilizes data mirroring has to double the disk space available. Another problem with data mirroring is that it results in a policy conflict for recording various media programs. Specifically, when recording a program on behalf of a customer, the Digital Millennium Copyright Act (DMCA) provides that one and only one unique instance of the data may be created for the customer.

Various implementations disclosed herein enable writing a number of copies of object data or parity data associated with a data segment to a fault-tolerant enterprise object storage system ("storage system", hereinafter for the sake of brevity). For example, in various implementations, a method of writing a number of copies of object data or parity data associated with a data segment is performed by a first storage entity of the storage system. In various implementations, the storage system includes an ingest entity and a plurality of storage entities that are configured to store data on a block basis. In various implementations, the first storage entity includes a non-transitory computer readable storage medium ("storage medium", hereinafter for the sake of brevity) and one or more processors. In various implementations, the method includes obtaining a data segment from the ingest entity in response to a request to write a number of copies of object data or parity data associated with the data segment. For example, in some implementations, obtaining the data segment includes retrieving the data segment from the ingest entity and/or the request.

In various implementations, the method includes determining whether the request is to write the object data associated with the data segment or the parity data associated with the data segment. In various implementations, the method includes writing the number of copies of the object data into the storage medium in response to determining that the request is to write the object data. In some implementations, writing the number of copies satisfies a shared resource utilization threshold in order to reduce utilization of a shared resource. In some implementations, the shared resource includes one or more of one or more communication channels, central processing unit (CPU) time, memory allocation, one or more interfaces, and bandwidth.

EXAMPLE EMBODIMENTS

FIG. 1 is a schematic diagram of a storage system environment 10. While certain specific features are illustrated, those of ordinary skill in the art will appreciate from the present disclosure that various other features have not been illustrated for the sake of brevity and so as not to obscure more pertinent aspects of the example implementations disclosed herein. To that end, the storage system environment 10 includes a fault-tolerant enterprise object storage system 100 ("storage system 100", hereinafter for the sake of brevity). In various implementations, the storage system 100 communicates with a content provider 40 over a network 30 (e.g., portions of the Internet and/or a private network). In some implementations, the content provider 40 provides content (e.g., video content such as movies and TV shows, audio content such as songs, podcasts and audio books, textual content such as e-books, etc.) to client devices 20. In various implementations, the content provider 40 utilizes the storage system 100 to store the content that the content provider 40 provides to the client devices 20. As such, in some implementations, the storage system 100 is a part of the content provider 40, or vice versa.

In various implementations, the storage system 100 stores content as one or more objects. In some implementations, an object refers to a data asset. In some implementations, an object includes a data asset that is presentable to a user via the client device 20. For example, the object includes a video file that represents a movie or a TV show, an audio file that represents a song or an audio book, a text file, etc. In various implementations, objects include files of various file types (e.g., .mov, .wma, .mp4, .avi, .mp3, .jpg, .txt, .doc, .docx, .xls, .ppt, etc.) In some implementations, an object includes a data asset that represents a set of computer-readable instructions that are executable at the client device 20. For example, in some implementations, the object includes a native application that is downloaded and installed at the client device 20, a browser plugin, etc.

In various implementations, the storage system 100 includes a cluster of storage entities 110, and an ingest entity 140. In the example of FIG. 1, the storage system 100 includes four storage entities 110: a first storage entity 110-1, a second storage entity 110-2, a third storage entity 110-3, and a fourth storage entity 110-4. However, in some examples, the storage system 100 includes a fewer number of storage entities 110, or a greater number of storage entities 110. The storage entities 110 store objects. In various implementations, some of the storage entities 110 are configured to store object data for the objects, and some of the remaining storage entities 110 are configured to store parity data for the objects. In some implementations, the storage entities 110 that store object data for the objects are referred to as data storage entities, and the storage entities 110 that store parity data for the objects are referred to as one or more parity storage entities. The storage system 100 utilizes any suitable combination of methods and systems to synthesize the parity data. In various implementations, the storage system 100 utilizes the parity data to recover (e.g., rebuild, reconstruct, restore, and/or repair) the objects in the event of a data loss. In some implementations, the storage entities 110 and the ingest entity 140 are network entities such as servers.

Figure 5:
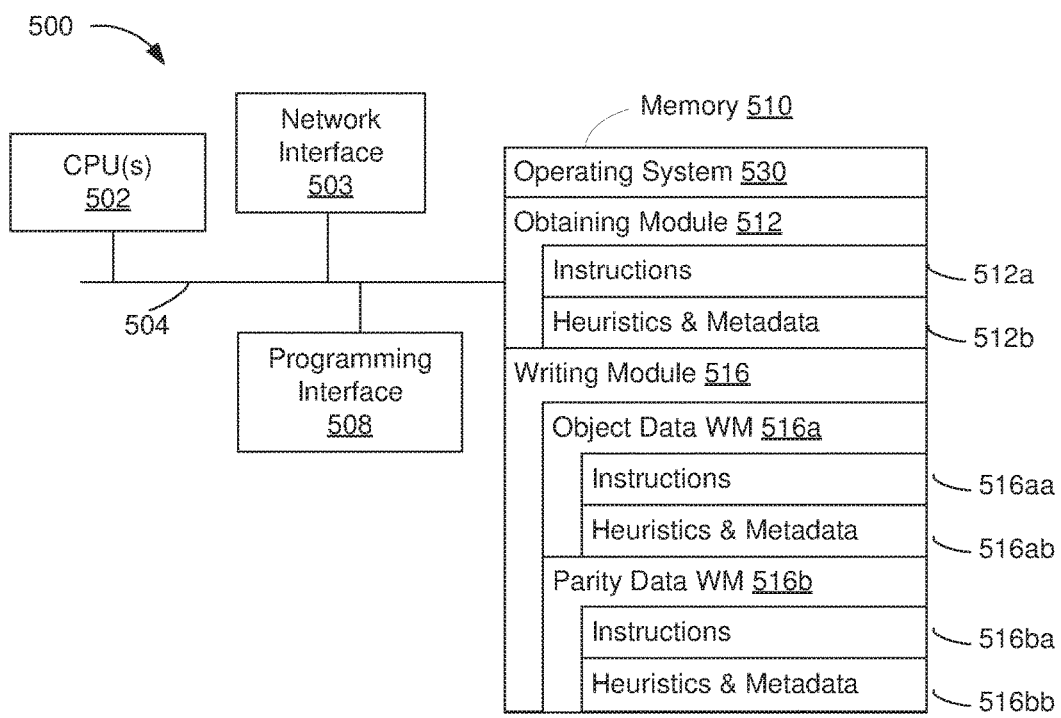
FIG. 5 is a block diagram of a server system enabled with various modules that are provided to write a number of copies of object data or parity data associated with a data segment in accordance with some implementations.

In some implementations, a storage entity 110 (e.g., each storage entity 110) includes one or more computer readable storage mediums. For example, the storage entity 110 includes solid state memory devices, hard disk memory devices, optical disk drives, read-only memory and/or nano-tube-based storage devices. In some implementations, the storage entities 110 includes servers that execute computer-readable instructions. In various implementations, a storage entity 110 includes various blocks. For example, in some implementations, a storage entity 110 that stores object data (e.g., the first storage entity 110-1 and the second storage entity 110-2) includes data blocks to store the object data. Similarly, a storage entity 110 that stores parity data (e.g., the third storage entity 110-3) includes parity blocks to store the parity data. As described herein, in various implementations, a block refers to the smallest addressable block of memory (e.g., the smallest allocation unit of data) in a storage entity 110. In some implementations, the blocks are identically-sized (e.g., 2 MB each) for processing convenience. In some implementations, a storage entity 110 includes hardware and/or software that enables the storage entity 110 to perform various operations described herein. In some examples, the storage entity 110 is implemented by a server system (e.g., as illustrated in FIG. 5).

In various implementations, the ingest entity 140 serves as an interface for the storage system 100. For example, in some implementations, the ingest entity 140 receives/transmits data from/to a device that is external to the storage system 100. In various examples, the ingest entity 140 receives/transmits data from/to the content provider 40 and/or the client devices 20. In various implementations, receiving/transmitting data includes receiving/transmitting the objects. Additionally and/or alternatively, receiving/transmitting data includes receiving/transmitting instructions. In some implementations, the instructions include operations that are performed in relation to the objects. Example instructions include writing an object (e.g., writing a number of copies of an object), reading an object, deleting an object, etc. In some implementations, the ingest entity 140 includes hardware and/or software that enables the ingest entity 140 to perform various operations described herein. In some examples, the ingest entity 140 is implemented by a server system. In some implementations, the ingest entity 140 is configured to operate as one of the storage entities 110. Put another way, in some implementations, one of the storage entities 110 is configured to operate as the ingest entity 140.

In various implementations, the storage system 100 utilizes various methods and systems associated with distributed erasure coding. In some implementations, the storage system 100 distributes an object across multiple storage entities 110. For example, the storage system 100 stores the first 2 MB of the object data at the first storage entity 110-1, the next 2 MB of the object data at the second storage entity 110-2, etc. In some implementations, the storage system 100 distributes the object across multiple storage entities 110 even if the object is small enough to be stored at a single storage entity 110. Distributing the object data and/or the parity data across multiple storage entities 110 reduces the risk of losing the entire object in the event of a data loss. In various implementations, an object, as described herein, is a data asset (e.g., a data item) that is stored in accordance with distributed erasure coding.

In various implementations, the storage system 100 includes one or more shared resources 160. In some implementations, a shared resource 160 includes a combination of hardware resources and/or software resources that are shared by the storage entities 110 and/or the ingest entity 140. For example, in some implementations, a shared resource 160 includes a communication channel 160a that the storage entities 110 utilize to communicate with the ingest entity 140. In some implementations, a shared resource 160 includes one or more central processing units 160b ("CPU 160b", hereinafter for the sake of brevity) associated with the ingest entity 140. In some implementations, a shared resource 160 includes a non-transitory memory 160c ("memory 160c", hereinafter for the sake of brevity) associated with the ingest entity 140. In some implementations, a shared resource 160 includes one or more interfaces 160d (e.g., communication interfaces such as ports) associated with the ingest entity 140. In some implementations, a shared resource 160 includes other types of resources (e.g., bandwidth).

In various implementations, the storage system 100 operates according to a shared resource utilization threshold in order to reduce utilization of the shared resource 160. In some implementations, the shared resource utilization threshold limits a number of utilizations of a shared resource 160 during an operation (e.g., a number of times the shared resource 160 is accessed during the operation). In some implementations, a shared resource utilization threshold limits a number of times that a storage entity 110 utilizes the communication channel 160a during a write operation. In some implementations, a shared resource utilization threshold limits an amount of time that the CPU 160b is utilized during a write operation. In some implementations, a shared resource utilization threshold limits an amount of time that the memory 160c stores an object. In some implementations, a shared resource utilization threshold limits a number of times that a storage entity 110 accesses an interface 160d during a write operation. In various implementations, operating according to the shared resource utilization threshold increases the robustness of the storage system 100. For example, in some implementations, operating according to the shared resource utilization threshold decreases a network congestion level within the storage system 100. In some implementations, operating according to the shared resource utilization threshold enables the storage system 100 to operate faster due to increased availability of the shared resource 160. For example, the storage system 100 is able to service requests (e.g., read requests, write requests, etc.) faster.

In various implementations, the storage system 100 (e.g., the ingest entity 140) receives a write request 42 to write a total number of copies 46 of a data segment 44 in the storage system 100. In various implementations, the data segment 44 includes a portion of an object. In other words, in various implementations, multiple data segments 44 form an object. In some implementations, the data segment 44 includes an entire object. In some implementations, the data segment 44 includes portions of multiple objects. In some implementations, the write request 42 includes the data segment 44. Additionally and/or alternatively, the write request 42 includes an identifier (ID) that identifies the data segment 44. In some examples, the storage system 100 currently stores at least one copy of the data segment 44. In such examples, the write request 42 is to replicate the stored copy of the data segment 44, so that the storage system 100 stores the total number of copies 46 of the data segment 44. In some implementations, the storage system 100 receives the write request 42 from the content provider 40.

In various implementations, the ingest entity 140 selects a set of storage entities 110 to collectively store the total number of copies 46 of the data segment 44. In some implementations, the ingest entity 140 selects a storage entity 110 based on an amount of available storage space in the storage entity 110. In various implementations, the ingest entity 140 selects the set of storage entities 110 such that each storage entity 110 in the set stores approximately the same number of copies. For example, in some implementations, the ingest entity 140 selects the set of storage entities 110 such that each storage entity 110 in the set stores an equal number of copies. In the example of FIG. 1, the ingest entity 140 selects the first storage entity 110-1, the second storage entity 110-2, and the third storage entity 110-3. In this example, the ingest entity 140 does not select the fourth storage entity 110-4.

As illustrated in FIG. 1, in various implementations, the ingest entity 140 transmits requests 142 to the set of selected storage entities 110. In the example of FIG. 1, the ingest entity 140 transmits a first request 142-1 to the first storage entity 110-1, a second request 142-2 to the second storage entity 110-2, and a third request 142-3 to the third storage entity 110-3. In various implementations, a request 142 includes an indication of the data segment 44, a number of copies 146, and a data type assignment 148. In some implementations, the data type assignment 148 indicates whether the storage entity 110 is to store a number of copies 146 of object data associated with the data segment 44, or a number of copies 146 of parity data associated with the data segment 44. In the example of FIG. 1, the first request 142-1 includes a first data type assignment 148-1 that indicates that the first storage entity 110-1 is to store a first number of copies 146-1 of object data associated with the data segment 44. Similarly, the second request 142-2 includes a second data type assignment 148-2 that indicates that the second storage entity 110-2 is to store a second number of copies 146-2 of object data associated with the data segment 44. In this example, the third request 142-3 includes a third data type assignment 148-3 that indicates that the third storage entity 110-3 is to store a third number of copies 146-3 of parity data associated with the data segment 44.

In the example of FIG. 1, a sum of the first number of copies 146-1 and the second number of copies 146-2 is equal to the total number of copies 46, and the third number of copies 146-3 is equal to the total number of copies 46. In other words, the ingest entity 140 selects the first storage entity 110-1 and the second storage entity 110-2 to collectively store the total number of copies 46 of object data associated with the data segment 44, and the third storage entity 110-3 to store the total number of copies 46 of parity data associated with the data segment. In various implementations, if the total number of copies 46 is an even number, then the first number of copies 146-1 and the second number of copies 146-2 are equal. Alternatively, if the total number of copies 46 is an odd number, then the first number of copies 146-1 is approximately equal to the second number of copies 146-2 (e.g., the first number of copies 146-1 is greater/less than the second number of copies 146-2 by one).

In various implementations, a storage entity 110 obtains the data segment 44 in response to receiving the request 142 from the ingest entity 140. In some implementations, the request 142 includes the data segment 44. In such implementations, the storage entity 110 obtains the data segment 44 by retrieving the data segment 44 from the request 142. In some implementations, the request 142 includes an ID that identifies the data segment 44. In such implementations, the storage entity 110 utilizes the ID to retrieve the data segment 44 from the ingest entity 140. In some examples, the storage entity 110 retrieves the data segment 44 when the storage entity 110 is ready to perform the write operation indicated by the request 142. In some implementations, the storage entity 110 stores the data segment 44 in a temporary storage (e.g., a cache) of the storage entity 110 after obtaining the data segment 44. In some examples, the storage entity 110 stores the data segment 44 in the temporary storage until the storage entity 110 has completed the write operation indicated by the request 142.

In various implementations, a storage entity 110 performs the write operation indicated by the request 142 according to a shared resource utilization threshold. For example, in some implementations, a number of times that the storage entity 110 utilizes (e.g., accesses) the communication channel 160a to obtain the data segment 44 from the ingest entity 140 is less than the number of copies 146 that the storage entity 110 writes. In some implementations, a number of times the storage entity 110 utilizes the communication channel 160a to obtain the data segment 44 from the ingest entity 140 is at least an order of magnitude less than the number of copies 146 that the storage entity 110 writes. In some examples, a number of times the storage entity 110 utilizes the communication channel 160a to obtain the data segment 44 from the ingest entity 140 is equal to one. In some implementations, the storage entity 110 indicates to the ingest entity 140 that the storage entity 110 has obtained the data segment 44.

In various implementations, the storage entity 110, instead of the ingest entity 140, writes the number of copies 146 of object/parity data in order to satisfy a shared resource utilization threshold that limits an amount of CPU time that the CPU 160b consumes to write the number of copies 146. In various implementations, the ingest entity 140 and/or the storage entity 110 purges the data segment 44 from the memory 160c of the ingest entity 140 after the storage entity 110 obtains the data segment 44. In some implementations, the data segment 44 is purged from the memory 160c in order to satisfy a shared resource utilization threshold that limits an amount of time that the data segment 44 is stored in the memory 160c. In various implementations, the storage entity 110 writes the number of copies 146 of object/parity data according to a shared resource utilization threshold that limits a number of times that the storage entity 110 utilizes (e.g., accesses) the interface 160d during the write operation. For example, a number of times that the storage entity 110 accesses the interface 160d to obtain the data segment 44 is less than the number of copies 146 that the storage entity 110 writes. In various implementations, the storage entity 110 writes the number of copies 146 of object/parity data according to a shared resource utilization threshold that limits an amount of bandwidth that the storage entity 110 utilizes during the write operation. In various implementations, the storage entity 110 satisfies the shared resource utilization threshold by storing the data segment 44 in a temporary storage after obtaining the data segment 44 from the ingest entity 140.

In various implementations, the storage entity 110 determines whether the request 142 is to write a number of copies 146 of object data or parity data associated with the data segment 44. In response to determining that the request 142 is to write a number of copies 146 of object data, the storage entity 110 writes the number of copies 146 of the object data into a storage medium (e.g., a persistent storage) of the storage entity 110. As described herein, in various implementations, the storage entity 110 writes the number of copies 146 of the object data according to a shared resource utilization threshold. In various implementations, the storage entity 110 writes a copy (e.g., each copy) of the data segment 44 into the persistent storage of the storage entity 110 by reading the data segment 44 from the temporary storage of the storage entity 110 (e.g., instead of reading the data segment 44 from the ingest entity 140 each time).

In various implementations, the storage entity 110 transmits a confirmation message 150 to the ingest entity 140 in response to completing the write operation. In some implementations, the confirmation message 150 indicates that the storage entity 110 has completed the write operation. In the example of FIG. 1, the first storage entity 110-1 transmits a first confirmation message 150-1 in response to writing a first number of copies 146-1 of object data associated with the data segment 44. Similarly, the second storage entity 110-2 transmits a second confirmation message 150-2 in response to writing a second number of copies 146-2 of object data associated with the data segment 44. In this example, the third storage entity 110-3 transmits a third confirmation message 150-3 in response to writing a third number of copies 146-3 of parity data associated with the data segment 44. More generally, in various implementations, the confirmation message 150 indicates that the storage entity 110 has written a number of copies 146 of object data or parity data associated with the data segment 44.

In various implementations, the storage entity 110 determines that the request 142 is to write a number of copies 146 of parity data associated with the data segment 44. In response to determining that the request 142 is to write a number of copies 146 of parity data, the storage entity 110 writes the number of copies 146 of the parity data into a storage medium (e.g., a persistent storage) of the storage entity 110. In various implementations, the storage entity 110 writes the number of copies 146 of the parity data according to a shared resource utilization threshold. In various implementations, writing the number of copies 146 of parity data includes synthesizing the number of copies 146 of the parity data. As described herein, in various implementations, the storage entity 110 satisfies the shared resource utilization threshold by repeatedly retrieving the data segment 44 from a temporary storage of the storage entity 110 instead of repeatedly obtaining the data segment 44 from the ingest entity 140.

In various implementations, the storage entity 110 synthesizes the number of copies of the parity data according to a processor utilization threshold. In some implementations, the processor utilization threshold limits a number of times that the storage entity 110 synthesizes the parity data to complete the write operation. In various implementations, the processor utilization threshold specifies that a number of times that the storage entity 110 synthesizes the parity data is less than the number of copies 146 of parity data that the storage entity 110 writes. In some implementations, the processor utilization threshold specifies that a number of times the storage entity 110 synthesizes the parity data is at least an order of magnitude less than the number of copies 146 of parity data that the storage entity 110 writes. In some implementations, the processor utilization threshold specifies that a number of times that the storage entity synthesizes the parity data is less than a number of parity blocks that collectively store the number of copies 146 of the parity data. In various implementations, the storage entity 110 writes the number of copies 146 of parity data according to the processor utilization threshold in order to reduce a number of CPU cycles allocated for the write operation. In various implementations, writing the number parity data according to the processor utilization threshold improves the efficiency of the storage system 100, reduces the power consumption of the storage system 100, and/or reduces the operating cost of operating the storage system 100.

Figure 2A:
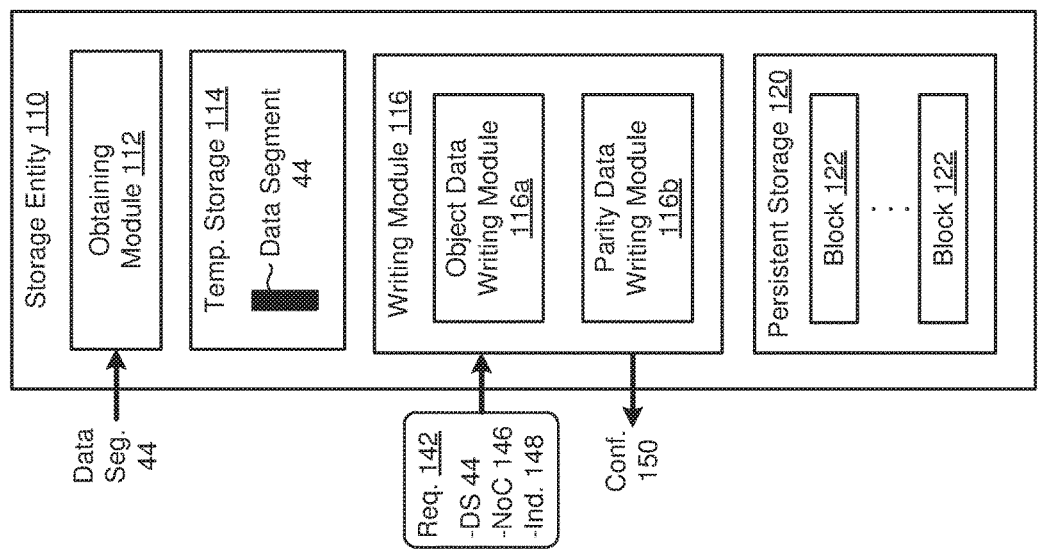
FIG. 2A is a block diagram of a storage entity of the fault-tolerant enterprise object storage system in accordance with some implementations.

FIG. 2A is a block diagram of a storage entity 110 in accordance with some implementations. In various implementations, the storage entity 110 includes an obtaining module 112, a temporary storage 114, a writing module 116, and a persistent storage 120. Briefly, in various implementations, the storage entity 110 receives a request 142 to write a number of copies 146 of object/parity data for a data segment 44, the obtaining module 112 obtains the data segment 44 and temporarily stores the data segment 44 in the temporary storage 44, and the writing module 116 writes the number of copies 146 of object/parity data for the data segment 44 into the persistent storage 120.

In various implementations, the obtaining module 112 obtains the data segment 44 in response to a request 142 to write a number of copies 146 of object/parity data associated with the data segment 44. In some implementations, the request 142 includes the data segment 44. In such implementations, the obtaining module 112 retrieves the data segment 44 from the request 142. In some implementations, the request 142 includes an identifier (ID) (e.g., a file name) that identifies the data segment 44. In such implementations, the obtaining module 112 utilizes the ID to retrieve the data segment 44. In some examples, the obtaining module 112 queries the ingest entity 140 with the ID, and receives the data segment 44 from the ingest entity 140 in response to the query. In some examples, the obtaining module 112 queries the persistent storage 120 with the ID, and receives the data segment 44 from the persistent storage 120 in response to the query. In some examples, the obtaining module 112 queries another storage entity 110 with the ID, and receives the data segment 44 from the other storage entity 110 in response to the query. In various implementations, the obtaining module 112 stores the data segment 44 in the temporary storage 114 after obtaining the data segment 44.

As illustrated in FIG. 2A, in various implementations, the temporary storage 114 temporarily stores the data segment 44. In some implementations, the temporary storage 114 stores the data segment 44 until the writing module 116 performs the write operation specified in the request 142. For example, the temporary storage 114 stores the data segment 44 until the writing module 116 writes the number of copies 146 of object/parity data into the persistent storage 120. In various implementations, the temporary storage 114 serves as a cache for the storage entity 110. To that end, the temporary storage 114 includes one or more non-transitory computer readable storage mediums (e.g., solid state memory devices, hard disk memory devices, optical disk drives, read-only memory and/or nanotube-based storage devices).

In various implementations, the writing module 116 writes a number of copies 146 of object/parity data associated with the data segment 44 into the persistent storage 120. As illustrated in FIG. 2A, in some implementations, the writing module 116 includes an object data writing module 116a and a parity data writing module 116b. In various implementations, the object data writing module 116a writes a number of copies 146 of object data associated with the data segment 44 into the persistent storage 120. In various implementations, the parity data writing module 116b writes a number of copies 146 of parity data associated with the data segment 44 into the persistent storage 120.

In various implementations, in response to receiving the request 142, the writing module 116 determines whether the request is to write object data or parity data based on the data type assignment 148. If the data type assignment 148 indicates that the request 142 is to write object data, the writing module 116 invokes (e.g., calls, for example, via a subroutine or an application programming interface (API)) the object data writing module 116a. If the data type assignment 148 indicates that the request 142 is to write parity data, the writing module 116 invokes the parity data writing module 116b. In some implementations, the writing module 116 transmits a confirmation message 150 to the ingest entity 140 in response to writing the number of copies 146 of object/parity data associated with the data segment 44.

Figure 2B:
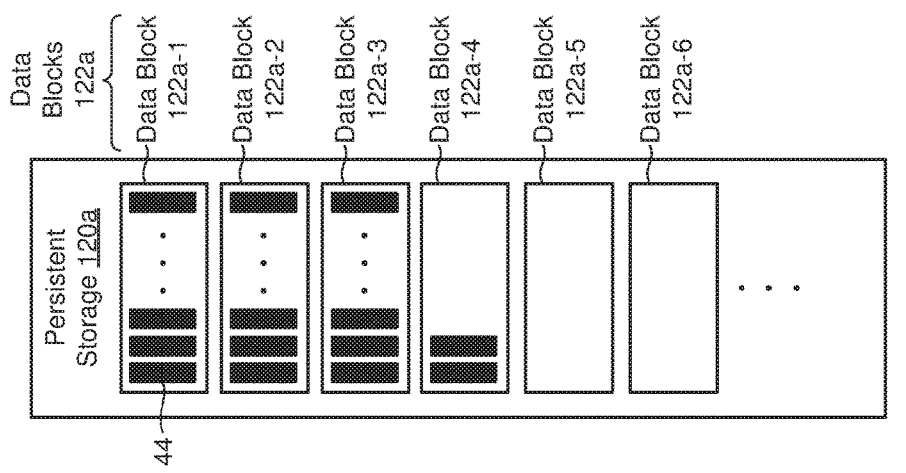
FIG. 2B is a block diagram that illustrates various data blocks in a persistent storage of a storage entity that is configured to store object data in accordance with some implementations.

In various implementations, the object data writing module 116a writes the number of copies 146 of object data associated with the data segment 44 according to a shared resource utilization threshold. For example, in some implementations, for each copy of object data that the object data writing module 116a writes, the object data writing module 116a reads the data segment 44 from the temporary storage 114 (e.g., instead of the ingest entity 140). As illustrated in FIG. 2B, the object data writing module 116a writes the number of copies 146 of object data into various data blocks 122a of the persistent storage 120a. In the example of FIG. 2B, the object data writing module 116a writes the number of copies 146 of object data into four data blocks 122a: a first data block 122a-1, a second data block 122a-2, a third data block 122a-3, and a fourth data block 122a-4. In this example, the first data block 122a-1, the second data block 122a-2 and the third data block 122a-3 are identical, since the first data block 122a-1, the second data block 122a-2 and the third data block 122a-3 store an equal number of copies of object data. As illustrated in FIG. 2B, the fourth data block 122a-4 is different from the prior three data blocks 122a-1, 122a-2 and 122a-3, since the fourth data block 122a-4 stores a fewer number of copies of object data. In various implementations, the object data writing module 116a stores an integer number of copies of object data in a data block 122a. To that end, the object data writing module 116a determines an unused amount of storage space in the data block 122a, and assigns an integer number of copies of object data to the data block 122a based on the unused amount of storage space.

Figure 2C:
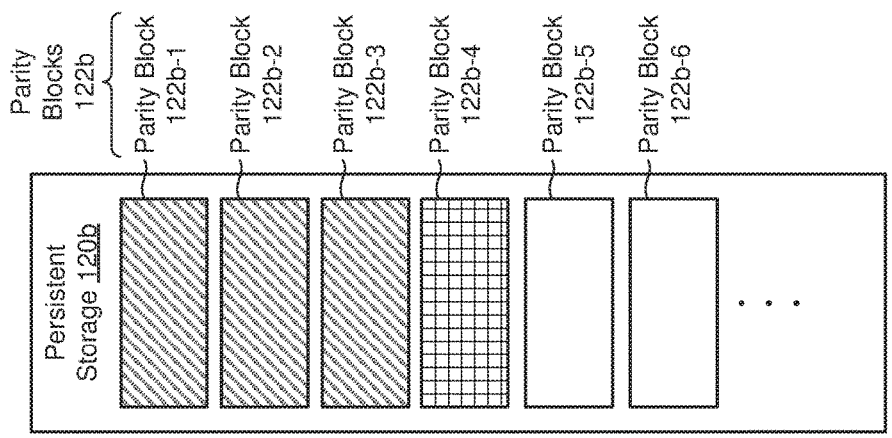
FIG. 2C is a block diagram that illustrates various parity blocks in a persistent storage of a storage entity that is configured to store parity data in accordance with some implementations.

In various implementations, the parity data writing module 116b writes the number of copies 146 of parity data associated with the data segment 44 according to a shared resource utilization threshold. For example, in some implementations, the parity data writing module 116b reads the data segment 44 from the temporary storage 114 (e.g., instead of the ingest entity 140). As illustrated in FIG. 2C, the parity data writing module 116b writes the number of copies 146 of parity data into various parity blocks 122b of the persistent storage 120b. In various implementations, the parity data writing module 116b writes the number of copies 146 of parity data according to a processor utilization threshold in order to conserve CPU cycles at the storage entity 110. For example, in some implementations, the parity data writing module 116b synthesizes parity data for a particular parity block 122b (e.g., a first parity block 122b-1), and writes the same parity data into multiple parity blocks 122b (e.g., the first parity block 122b-1, a second parity block 122b-2, and a third parity block 122b-3).

In various implementations, the processor utilization threshold specifies that a number of times that the parity data writing module 116b synthesizes the parity data is less than a number of parity blocks 122a that store the number of copies 146 of the parity data. In various implementations, the parity data writing module 116b synthesizes parity data for two parity blocks 122b. For example, in some implementations, the parity data writing module 116b identifies a group of parity blocks 122b to store the number of copies 146 of the parity data (e.g., parity blocks 122b-1 ... 122b-4). In such implementations, the parity data writing module 116b synthesizes parity data for the first and last parity blocks 122b in the group (e.g., the first parity block 122b-1, and the fourth parity block 122b-4). In such implementations, the parity data writing module 116b copies the parity data synthesized for the first party block 122b (e.g., the first parity block 122b-1) into the remaining parity blocks 122b of the group (e.g., the second parity block 122b-2 and the third parity block 122b-3).

In various implementations, the parity data writing module 116b synthesizes parity data for a parity block 122b based on object data that is stored in a set of data blocks 122a that are associated with the parity block 122b. In some implementations, the set of data blocks 122a is referred to as a data block set. In some implementations, the parity data writing module 116b determines that numerous data block sets are identical. In such implementations, the parity data writing module 116b synthesizes parity data for a first data block set (e.g., the first data block 122a-1 in FIG. 2B), and utilizes the same parity data for the remaining data block sets that are identical to the first data block set (e.g., data blocks 122a-2 and 122a-3 in FIG. 2B). More generally, in various implementations, if the parity data writing module 116b determines that a number of data block sets are identical, then the parity data writing module 116b synthesizes parity data for some of the data block sets (e.g., one of the data block sets, for example, the first data block set) instead of synthesizing parity data for each data block set. In various implementations, the processor utilization threshold is a function of (e.g., less than) a number of parity blocks 122b that are to store the number of copies 146 of parity data. In various implementations, the parity data writing module 116b writes the number of copies 146 of parity data according to the processor utilization threshold in order to reduce the power usage of the storage entity 110, and/or increase the processing availability of the storage entity 110.

Figure 3:
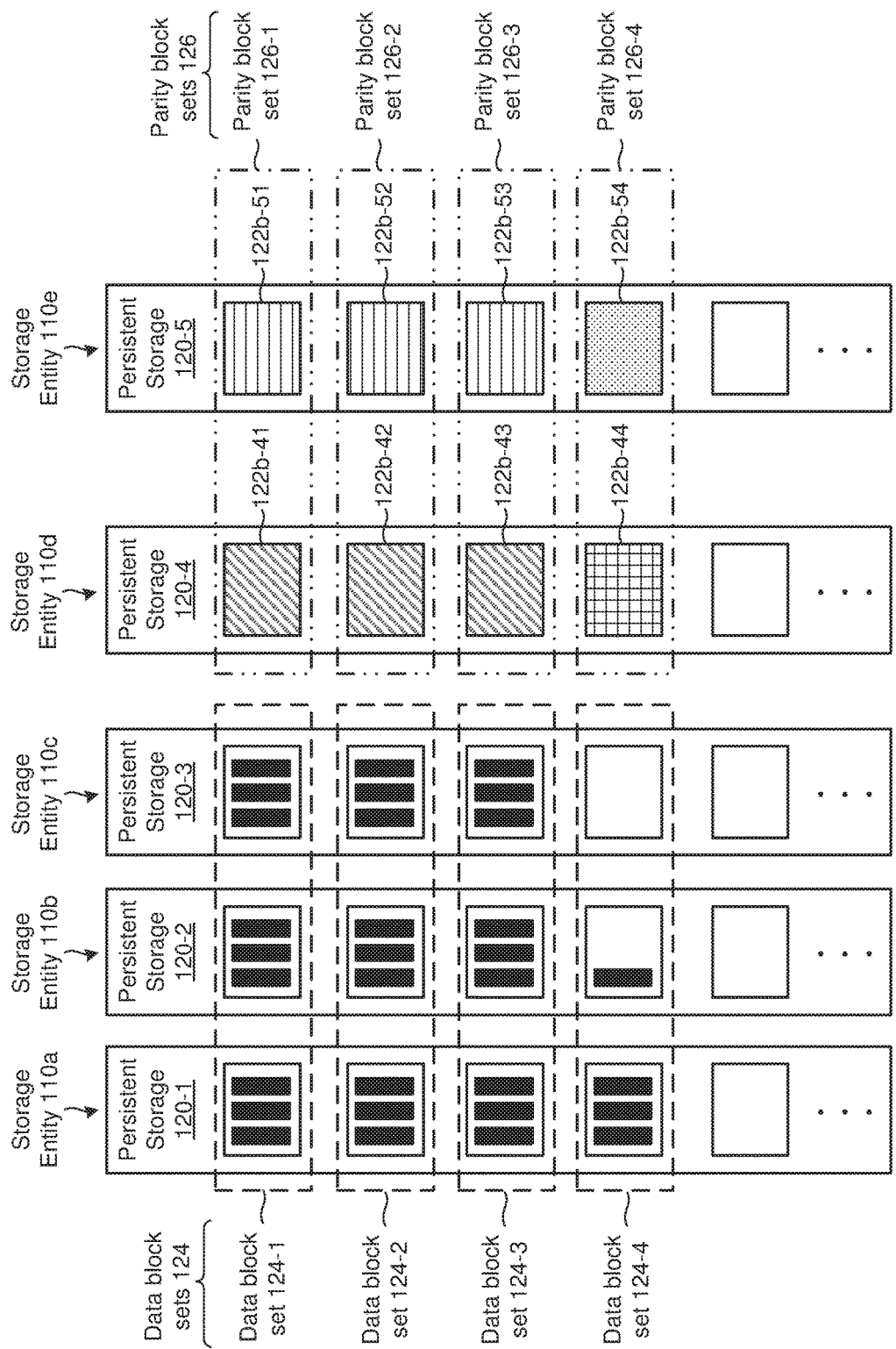
FIG. 3 is a block diagram that illustrates data blocks and parity blocks stored across five persistent storages from five storage entities in accordance with some implementations.

FIG. 3 is a block diagram that illustrates five persistent storages 120 of five different storage entities 110 (e.g., storage entities 110a ... 110e). In the example of FIG. 3, a first persistent storage 120-1, a second persistent storage 120-2 and a third persistent storage 120-3 collectively store a total number of copies 46 of object data in various data blocks 122a, whereas a fourth persistent storage 120-4 and a fifth persistent storage store parity data in various parity blocks 122b. As illustrated in FIG. 3, the persistent storages 120-1, 120-2 and 120-3 include some identical data block sets 124. For example, a first data block set 124-1, a second data block set 124-2 and a third data block set 124-3 are identical because these data block sets 124-1, 124-2 and 124-3 store an equal number of copies of object data. In this example, a fourth data block set 124-4 is different from the prior three data block sets 124-1, 124-2 and 124-3 because the fourth data block set 124-4 stores fewer copies of object data.

As illustrated in FIG. 3, the fourth persistent storage 120-4 and the fifth persistent storage 120-5 collectively store various parity block sets 126 (e.g., parity block sets 126-1 ... 126-4). The parity block sets 126 represent parity data for their corresponding data block sets 124. For example, a first parity block set 126-1 represents parity data for the first data block set 124-1, a second parity block set 126-2 represents parity data for the second data block set 126-2, etc. In the example of FIG. 3, the first three parity block sets 126-1, 126-2 and 126-3 are identical because the first three data block sets 124-1, 124-2 and 124-3 are identical. In various implementations, if a group of data block sets 124 are identical, then their corresponding parity block sets 126 are also identical. As such, in various implementations, the storage entities 110 that store parity block sets 126 synthesize a parity block set 126 for one of the data block sets 124 in the group of identical data block sets 124, and replicate the synthesized parity block set 126.

In the example of FIG. 3, the fourth storage entity 110d determines that the first three data block sets 124-1 ... 124-3 are identical. As such, the fourth storage entity 110d synthesizes a parity block 122b-41, and replicates the parity block 122b-41 to form the parity blocks 122b-42 and 122b-43. Similarly, the fifth storage entity 110e determines that the first three data block sets 124-1 ... 124-3 are identical. As such, the fifth storage entity 110e synthesizes a parity block 122b-51, and replicates the parity block 122b-51 to form the parity blocks 122b-52 and 122b-53. Since the fourth data block set 124-4 is different from the prior three data block sets 124-1 ... 124-3, the fourth storage entity 110d synthesizes parity block 122b-44 and the fifth storage entity 110e synthesizes parity block 122b-54. As such, in various implementations, a number of times that a storage entity 110 synthesizes parity data is less than the number of parity blocks that the storage entity 110 stores. In some implementations, the number of times that a storage entity 110 synthesizes parity data is less than or equal to two. In some implementations, the number of times that a storage entity 110 synthesizes parity data is equal to one (e.g., when all the data blocks sets 124 are identical).

Figure 4:
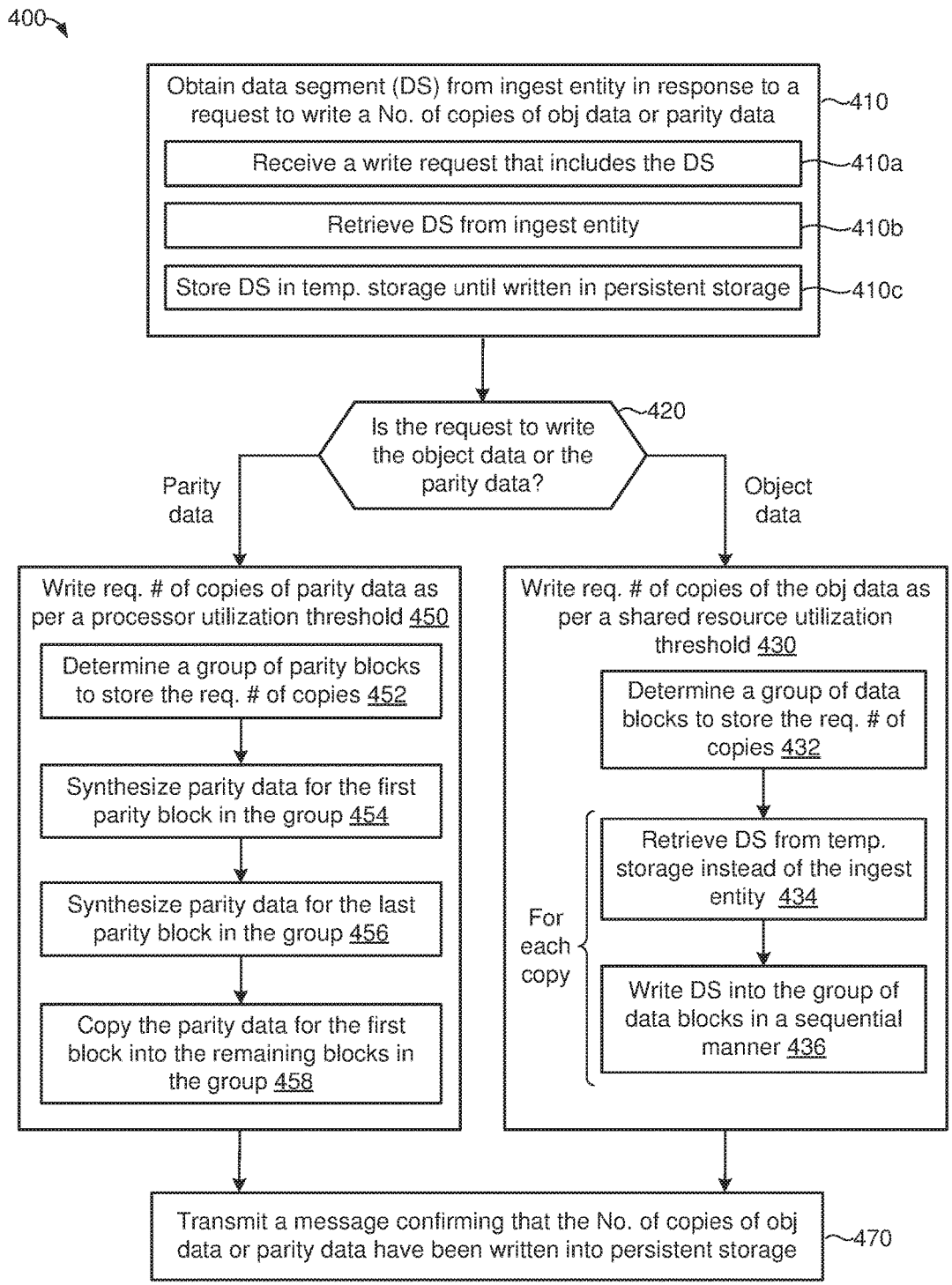
FIG. 4 is a flowchart representation of a method of writing a number of copies of object data or parity data associated with a data segment in accordance with some implementations.

FIG. 4 is a flowchart representation of a method 400 of writing a number of copies of object data or parity data associated with a data segment (e.g., the data segment 44 shown in FIGS. 1-3) in accordance with some implementations. In various implementations, the method 400 is implemented as a set of computer readable instructions that are executed at a storage system (e.g., the storage system 100 shown in FIG. 1). For example, in various implementations, the method 400 is performed by the storage entity 110 shown in FIG. 2A. Briefly, the method 400 includes obtaining a data segment from an ingest entity in response to a request to write a number of copies of object data or parity data, determining whether the request is to write object data or parity data, and in response to determining that the request is to write object data, writing the number of copies of object data according to a shared resource utilization threshold.

As represented by block 410, in various implementations, the method 400 includes obtaining a data segment from an ingest entity in response to a request to write a number of copies of object data or parity data associated with the data segment. For example, as illustrated in FIG. 1, in some implementations, the method 400 includes obtaining the data segment 44 from the ingest entity 140 in response to the request 142 to write a number of copies 146 of object data or parity data associated with the data segment 44. As represented by block 410a, in some implementations, the method 400 includes receiving a write request (e.g., the request 142 shown in FIGS. 1 and 2A) that includes the data segment. In such implementations, the method 400 includes retrieving the data segment from the write request. As represented by block 410b, in some implementations, the method 400 includes retrieving the data segment from the ingest entity. For example, in some implementations, the request includes an ID that identifies the data segment, and the method 400 includes utilizing the ID to retrieve the data segment from the ingest entity. As represented by block 410c, in some implementations, the method 400 includes storing the data segment in a temporary storage (e.g., the temporary storage 114 shown in FIG. 2A). In some examples, the method 400 includes storing the data segment in the temporary storage at least until the number of copies of object data or parity data associated with the data segment are written into a persistent storage of the storage entity (e.g., the persistent storage 120 shown in FIG. 2A).

As represented by block 420, in various implementations, the method 400 includes determining whether the request is to write a number of copies of object data associated with the data segment, or a number of copies of parity data associated with the data segment. In some implementations, the method 400 includes identifying a data type assignment in the request (e.g., the data type assignment 148 shown in FIG. 1). If the data type assignment indicates that the request is for writing object data, then the method 400 includes determining that the request is to write object data. If the data type assignment indicates that the request is for writing parity data, then the method 400 includes determining that the request is to write parity data.

As represented by block 430, in various implementations, in response to determining that the request is to write object data, the method 400 includes writing the requested number of copies of object data into the persistent storage in accordance with a shared resource utilization threshold in order to reduce utilization of a shared resource. As represented by block 432, in various implementations, the method 400 includes determining a group of data blocks to store the requested number of copies of object data. As represented by blocks 434 and 436, in various implementations, for each copy that is written, the method 400 includes retrieving the data segment from the temporary storage and writing the data segment into the group of data blocks in a sequential manner. As described herein, in various implementations, the method 400 includes repeatedly retrieving the data segment from the temporary storage instead of repeatedly retrieving the data segment from the ingest entity. In various implementations, retrieving the data segment from the temporary storage instead of the ingest entity reduces the utilization of a shared resource (e.g., the shared resources 160 shown in FIG. 1).

As represented by block 450, in various implementations, in response to determining that the request is to write parity data, the method 400 includes writing the requested number of copies of parity data into the persistent storage in accordance with the shared resource utilization threshold and/or a processor utilization threshold. As represented by block 452, in various implementations, the method 400 includes determining a group of parity blocks to store the requested number of copies of parity data. As represented by block 454, in various implementations, the method 400 includes synthesizing parity data for the first parity block in the group. As represented by block 456, in various implementations, the method 400 includes synthesizing parity data for the last parity block in the group. As represented by block 458, in various implementations, the method 400 includes copying the parity data synthesized for the first parity block into the remaining parity blocks in the group. In various implementations, copying the parity data into the remaining parity blocks instead of synthesizing the parity data for each of the remaining parity blocks reduces the utilization of a processor (e.g., a CPU) associated with the storage entity. As represented by block 470, in various implementations, the method 400 includes transmitting a message (e.g., the confirmation message 150 shown in FIG. 1) confirming that the number of copies of object data or parity data have been written into persistent storage.

FIG. 5 is a block diagram of a server system 500 enabled with one or more components of a storage entity (e.g., the storage entity 110 shown in FIGS. 1 and 2A) in accordance with some implementations. While certain specific features are illustrated, those of ordinary skill in the art will appreciate from the present disclosure that various other features have not been illustrated for the sake of brevity, and so as not to obscure more pertinent aspects of the implementations disclosed herein. To that end, as a non-limiting example, in some implementations the server system 500 includes one or more processing units (CPUs) 502, a network interface 503, a memory 510, a programming interface 508, and one or more communication buses 504 for interconnecting these and various other components.

In some implementations, the network interface 503 is provided to, among other uses, establish and maintain a metadata tunnel between a cloud hosted network management system and at least one private network including one or more compliant devices. In some implementations, the communication buses 504 include circuitry that interconnects and controls communications between system components. The memory 510 includes high-speed random access memory, such as DRAM, SRAM, DDR RAM or other random access solid state memory devices; and may include non-volatile memory, such as one or more magnetic disk storage devices, optical disk storage devices, flash memory devices, or other non-volatile solid state storage devices. The memory 510 optionally includes one or more storage devices remotely located from the CPU(s) 502. The memory 510 comprises a non-transitory computer readable storage medium.

In some implementations, the memory 510 or the non-transitory computer readable storage medium of the memory 510 stores the following programs, modules and data structures, or a subset thereof including an optional operating system 530, an obtaining module 512, and a writing module 516. In some implementations, the writing module 516 includes an object data writing module 516a, and/or a parity data writing module 516b. In various implementations, the obtaining module 512 and the writing module 516 are similar to the obtaining module 112 and the writing module 116, respectively, shown in FIG. 2A. In various implementations, the operating system 530 includes procedures for handling various basic system services and for performing hardware dependent tasks.

In various implementations, the obtaining module 512 obtains a data segment from an ingest entity in response to a request to write a number of copies of object data or parity data associated with the data segment. To that end, in various implementations, the obtaining module 512 includes instructions and/or logic 512a, and heuristics and metadata 512b. In various implementations, the writing module 516 determines whether the request is to write a number of copies of object data associated with the data segment, or a number of copies of parity data associated with the data segment. In various implementations, the object data writing module 516a writes a number of copies of object data associated with the data segment into a persistent storage. To that end, in various implementations, the object data writing module 516a includes instructions and/or logic 516aa, and heuristics and metadata 516ab. In various implementations, the parity data writing module 516b writes a number of copies of parity data associated with the data segment into the persistent storage. To that end, in various implementations, the parity data writing module 516b includes instructions and/or logic 516ba, and heuristics and metadata 516bb.

While various aspects of implementations within the scope of the appended claims are described above, it should be apparent that the various features of implementations described above may be embodied in a wide variety of forms and that any specific structure and/or function described above is merely illustrative. Based on the present disclosure one skilled in the art should appreciate that an aspect described herein may be implemented independently of any other aspects and that two or more of these aspects may be combined in various ways. For example, an apparatus may be implemented and/or a method may be practiced using any number of the aspects set forth herein. In addition, such an apparatus may be implemented and/or such a method may be practiced using other structure and/or functionality in addition to or other than one or more of the aspects set forth herein.

It will also be understood that, although the terms "first," "second," etc. may be used herein to describe various elements, these elements should not be limited by these terms. These terms are only used to distinguish one element from another. For example, a first contact could be termed a second contact, and, similarly, a second contact could be termed a first contact, which changing the meaning of the description, so long as all occurrences of the "first contact" are renamed consistently and all occurrences of the second contact are renamed consistently. The first contact and the second contact are both contacts, but they are not the same contact.

The terminology used herein is for the purpose of describing particular embodiments only and is not intended to be limiting of the claims. As used in the description of the embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

What is claimed is:

1. A method comprising:
at a first storage entity of an enterprise storage system configured to store at least a portion of a unique instance of an object for each one of a plurality of clients, the enterprise storage system including an ingest entity and a plurality of storage entities configured to store data on a block basis, the first storage entity including a storage medium and one or more processors:
obtaining a data segment from the ingest entity in response to a request to write a number of copies of object data or parity data associated with the data segment, each copy of the object data being associated with the unique instance of the object being stored for a respective client for subsequent retrieval;
determining whether the request is to write the object data associated with the data segment or the parity data associated with the data segment; and
in response to determining that the request is to write the object data, writing the number of copies of the object data into the storage medium in accordance with a shared resource utilization threshold, wherein the shared resource is shared between the ingest entity and the plurality of storage entities.

2. The method of claim 1, wherein the shared resource includes a communication channel between the ingest entity and the plurality of storage entities; and where the shared resource utilization threshold indicates a number of times that the first storage entity utilizes the communication channel is less than the number of copies.

3. The method of claim 1, wherein the shared resource includes a central processing unit (CPU) time associated with the ingest entity; and wherein the shared resource utilization threshold limits the CPU time that the first storage entity utilizes during the writing.

4. The method of claim 1, further comprising:
in response to determining that the request is to write the parity data, writing the number of copies of the parity data into the storage medium according to a processor utilization threshold.

5. The method of claim 4, wherein writing the parity data comprises:
synthesizing the parity data for a first parity block; and
writing the synthesized parity data into a plurality of other parity blocks in order to satisfy the processor utilization threshold.

6. The method of claim 4, wherein the processor utilization threshold indicates that a number of times the parity data is synthesized is less than a number of parity blocks that store the number of copies of the parity data.

7. The method of claim 4, wherein the number of copies of the parity data are written into a group of parity blocks; and wherein the writing the parity data comprises:
synthesizing the parity data for the first parity block in the group;
synthesizing the parity data for the last parity block in the group; and
copying the parity data for the first parity data into the remaining parity blocks of the group.

8. The method of claim 1, wherein obtaining the data segment comprises:
receiving the request from the ingest entity, the data segment is included in the request.

9. The method of claim 1, further comprising:
wherein the object comprises a media program, and
wherein each copy of the object data is associated with a unique instance of the media program being recorded for a respective client for subsequent retrieval.

10. The method of claim 1, wherein the first storage entity further comprises a non-transitory memory; and the method further comprising:
in response to obtaining the data segment from the ingest entity, storing the data segment in the non-transitory memory at least until writing the number of copies of the object data into the storage medium.

11. The method of claim 10, wherein writing the number of copies of the object data into the storage medium comprises:

for each copy:
reading the data segment from the non-transitory memory.

12. The method of claim 1, further comprising:
transmitting a message to the ingest entity to indicate that the number of copies of the object data or the parity data associated with the data segment have been written into the storage medium of the first storage entity.

13. The method of claim 1, wherein writing the number of copies of the object data comprises:
assigning an integer number of copies of the object data to a data block; and
storing the integer number of copies in the assigned data block.

14. The method of claim 13, wherein assigning the integer number of copies of the object data comprises:
determining an unused amount of storage space in the data block; and
determining the integer number based on the unused amount of storage space and a size of the data segment.

15. A method comprising:
at an enterprise storage system configured to store at least a portion of a unique instance of an object for each one of a plurality of clients, the enterprise storage system including an ingest entity and a plurality of storage entities configured to store data on a block basis, wherein a first storage entity from the plurality of storage entities includes a storage medium and one or more processors:
obtaining, at the first storage entity, a data segment from the ingest entity in response to a request to write a number of copies of object data or parity data associated with the data segment, each copy of the object data being associated with the unique instance of the object being stored for a respective client for subsequent retrieval;
determining, by the first storage entity, whether the request is to write the object data associated with the data segment or the parity data associated with the data segment; and
in response to determining that the request is to write the object data, writing the number of copies of the object data into the storage medium in accordance with a shared resource utilization threshold, wherein the shared resource is shared between the ingest entity and the plurality of storage entities.

16. The method of claim 15, further comprising:
transmitting, by the ingest entity, the request to the first storage entity, wherein the request includes one of: the data segment and an identifier (ID) that identifies the data segment.

17. An enterprise object storage system comprising:
an ingest entity that serves as an interface for the enterprise object storage system which is configured to record at least a portion of a unique instance of a media program for each one of a plurality of clients; and
a plurality of storage entities configured to store data on a block basis, wherein a first storage entity from the plurality of storage entities includes a storage medium and one or more processors that, in response to executing computer executable instructions, cause the first storage entity to:
obtain a data segment from the ingest entity in response to a request to write a number of copies of object data or parity data associated with the data segment, each copy of the object data being associated with the unique instance of the media program being recorded for a respective client for subsequent retrieval;
determine whether the request is to write the object data associated with the data segment or the parity data associated with the data segment; and
in response to determining that the request is to write the object data, write the number of copies of the object data into the storage medium in accordance with a shared resource utilization threshold, wherein the shared resource is shared between the ingest entity and the plurality of storage entities.

18. The enterprise object storage system of claim 17, wherein the shared resource includes a communication channel between the ingest entity and the plurality of storage entities; and wherein the shared resource utilization threshold indicates that a number of times that the first storage entity utilizes the communication channel is less than the number of copies.

19. The enterprise object storage system of claim 1, wherein the one or more processors further cause the first storage entity to:
in response to determining that the request is to write the parity data:
synthesize the parity data for a first parity block; and
write the synthesized parity data into the first parity block and a plurality of remaining parity blocks.

20. The enterprise object storage system of claim 19, wherein the ingest entity includes one or more processors and a non-transitory memory including computer readable instructions that, when executed by the one or more processors, cause the ingest entity to:
transmit the request to the first storage entity, wherein the request includes one of: the data segment and an identifier (ID) that identifies the data segment,
wherein the enterprise object storage system is configured to record media programs comprising video.

* * * * *